(12) United States Patent
Jin et al.

(10) Patent No.: US 9,209,335 B2
(45) Date of Patent: Dec. 8, 2015

(54) SOLAR CELL SYSTEM

(75) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 433 days.

(21) Appl. No.: 13/474,920

(22) Filed: May 18, 2012

(65) Prior Publication Data

US 2013/0146119 A1 Jun. 13, 2013

(30) Foreign Application Priority Data

Dec. 9, 2011 (CN) .......................... 2011 1 0408591

(51) Int. Cl.
*H01L 31/05* (2014.01)
*H01L 31/0352* (2006.01)
*H01L 31/043* (2014.01)
*H01L 31/047* (2014.01)

(52) U.S. Cl.
CPC .... *H01L 31/0504* (2013.01); *H01L 31/035272* (2013.01); *H01L 31/043* (2014.12); *H01L 31/047* (2014.12); *H01L 2924/0002* (2013.01); *Y02E 10/50* (2013.01)

(58) Field of Classification Search
CPC ....................................................... H01L 31/05
USPC ........................ 136/244, 252, 256, 259, 261
See application file for complete search history.

(56) References Cited

U.S. PATENT DOCUMENTS

| 3,422,527 | A | | 1/1969 | Gault et al. |
| 3,454,843 | A | | 7/1969 | Fulop et al. |
| 4,131,984 | A | | 1/1979 | Kaplow et al. |
| 4,409,422 | A | | 10/1983 | Sater |
| 5,071,490 | A | * | 12/1991 | Yokota et al. ................. 136/249 |

(Continued)

FOREIGN PATENT DOCUMENTS

| CN | 1625812 | 6/2005 |
| CN | 101527327 | 9/2009 |

(Continued)

OTHER PUBLICATIONS

K.S.Lee et al., "Transferred vetically aligned N-doped carbon nanotube arrays:use in dye-sensitized solar cell as counter electrodes", Chemical, vol. 47, No. 14,pp. 4264-4266, Apr. 14, 2011.

*Primary Examiner* — Susan D Leong
(74) *Attorney, Agent, or Firm* — Novak Druce Connolly Bove + Quigg LLP (57) ABSTRACT

A solar cell system includes two solar cells. The two solar cells are located in contact with each other and connected in parallel. Each of the two solar cells includes a first electrode layer, a P-type silicon layer, an N-type silicon layer, and a second electrode layer. The first electrode layer, the P-type silicon layer, the N-type silicon layer, and the second electrode layer are arranged in series side by side along a first direction and in contact with each other, thereby cooperatively forming a integrated structure. A P-N junction is formed near an interface between the P-type silicon layer and the N-type silicon layer. The integrated structure has a first surface substantially parallel to the first direction and a second surface opposite to the first surface. The first surface is used as a photoreceptive surface to directly receive incident light.

15 Claims, 6 Drawing Sheets

(56) References Cited

U.S. PATENT DOCUMENTS

| | | |
|---|---|---|
| 6,350,945 B1 | 2/2002 | Mizuno |
| 6,744,073 B1 | 6/2004 | Nakata |
| 7,829,781 B2 * | 11/2010 | Montello et al. ............ 136/244 |
| 8,450,717 B1 | 5/2013 | Samuelson et al. |
| 2003/0005954 A1 | 1/2003 | Emoto et al. |
| 2005/0178431 A1 | 8/2005 | Yang et al. |
| 2006/0043390 A1 | 3/2006 | Nakata |
| 2008/0083448 A1 * | 4/2008 | Borden ........................ 136/243 |
| 2008/0185033 A1 | 8/2008 | Kalejs |
| 2008/0303131 A1 | 12/2008 | McElrea et al. |
| 2008/0308156 A1 * | 12/2008 | Boyer, Jr. ..................... 136/262 |
| 2009/0056698 A1 * | 3/2009 | Johnson et al. ............... 126/569 |
| 2009/0194162 A1 * | 8/2009 | Sivaram et al. ............... 136/258 |
| 2009/0211633 A1 | 8/2009 | Schilinsky et al. |
| 2009/0223558 A1 | 9/2009 | Sun et al. |
| 2009/0250113 A1 | 10/2009 | Sun et al. |
| 2009/0268446 A1 * | 10/2009 | Lai et al. ..................... 362/234 |
| 2010/0018579 A1 | 1/2010 | Curran |
| 2010/0275965 A1 * | 11/2010 | Lee et al. ..................... 136/244 |
| 2011/0005575 A1 * | 1/2011 | Cao .............................. 136/246 |
| 2011/0132427 A1 * | 6/2011 | Kalkanoglu et al. .......... 136/244 |
| 2011/0168246 A1 | 7/2011 | Tsai |
| 2011/0186114 A1 | 8/2011 | Homma et al. |
| 2012/0152322 A1 | 6/2012 | Kribus et al. |
| 2012/0152340 A1 | 6/2012 | Kondo et al. |
| 2012/0266953 A1 | 10/2012 | Borrello et al. |

FOREIGN PATENT DOCUMENTS

| | | |
|---|---|---|
| CN | 201801461 | 4/2011 |
| CN | 102232246 | 11/2011 |
| JP | 62-105485 | 5/1987 |
| JP | 1-111887 | 4/1989 |
| JP | 2-9176 | 1/1990 |
| JP | 2001-313401 | 11/2001 |
| JP | 2004-281758 | 10/2004 |
| JP | 2006-73985 | 3/2006 |
| JP | 2011-86647 | 4/2011 |
| TW | 201113389 | 4/2011 |
| TW | M416877 | 11/2011 |
| WO | WO03094248 | 11/2003 |

* cited by examiner

SOLAR CELL SYSTEM

CROSS-REFERENCE TO RELATED APPLICATIONS

This application claims all benefits accruing under 35 U.S.C. §119 from China Patent Application No. 201110408591.2, filed on Dec. 9, 2011, in the China Intellectual Property Office, the contents of which are hereby incorporated by reference.

BACKGROUND

1. Technical Field

The present disclosure relates to a solar cell system.

2. Description of Related Art

An operating principle of a solar cell is photoelectric effect of a semiconducting material. The solar cells can be roughly classified into silicon-based solar cells, gallium arsenide solar cells, and organic thin film solar cells.

A silicon-based solar cell commonly includes a rear electrode, a P-type silicon layer, an N-type silicon layer, and a front electrode. The P-type silicon layer can be made of polycrystalline silicon or monocrystalline silicon and has a first surface and a flat second surface opposite to the first surface. The rear electrode is disposed on and in ohmic contact with the first surface of the P-type silicon layer. The N-type silicon layer is formed on the second surface of the P-type silicon layer and serves as a photoelectric conversion element. The N-type silicon layer has a flat surface. The front electrode is disposed on the flat surface of the N-type silicon layer. The P-type silicon layer and the N-type silicon layer cooperatively form a P-N junction near an interface of the P-type silicon layer and the N-type silicon layer. In use, light directly irradiates the front electrode, and reaches the P-N junction through the front electrode and the N-type silicon layer. Consequently, a plurality of electron-hole pairs (carriers) can be generated in the P-N junction due to photon excitation. Electrons and holes in the electron-hole pairs can be separated from each other and separately move toward the rear electrode and the front electrode under an electrostatic potential. If a load is connected between the front electrode and the rear electrode, a current can flow through the load.

However, a light absorbing efficiency of the P-N junction of the above solar cell is low, because partial photons in the incident light are absorbed by the front electrode and the N-type silicon layer. Thus, carriers generated by exciting of photons in the P-N junction are relatively few, and a photoelectric conversion efficiency of the solar cell is relatively low.

What is needed, therefore, is to provide a solar cell having high photoelectric conversion efficiency, and a solar cell system using the same.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
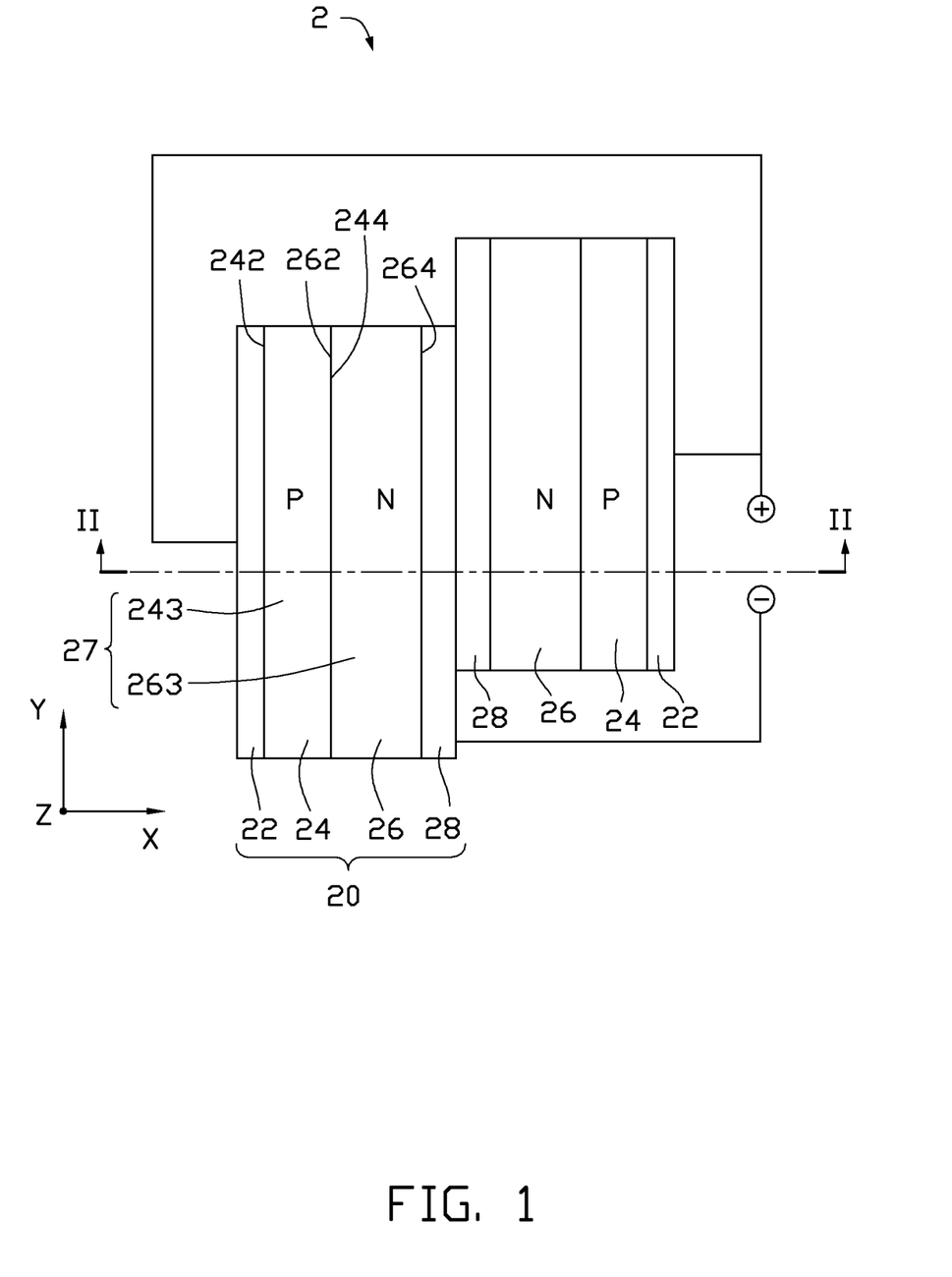
FIG. 1 is a top view of a first embodiment of a solar cell system.
Figure 2:
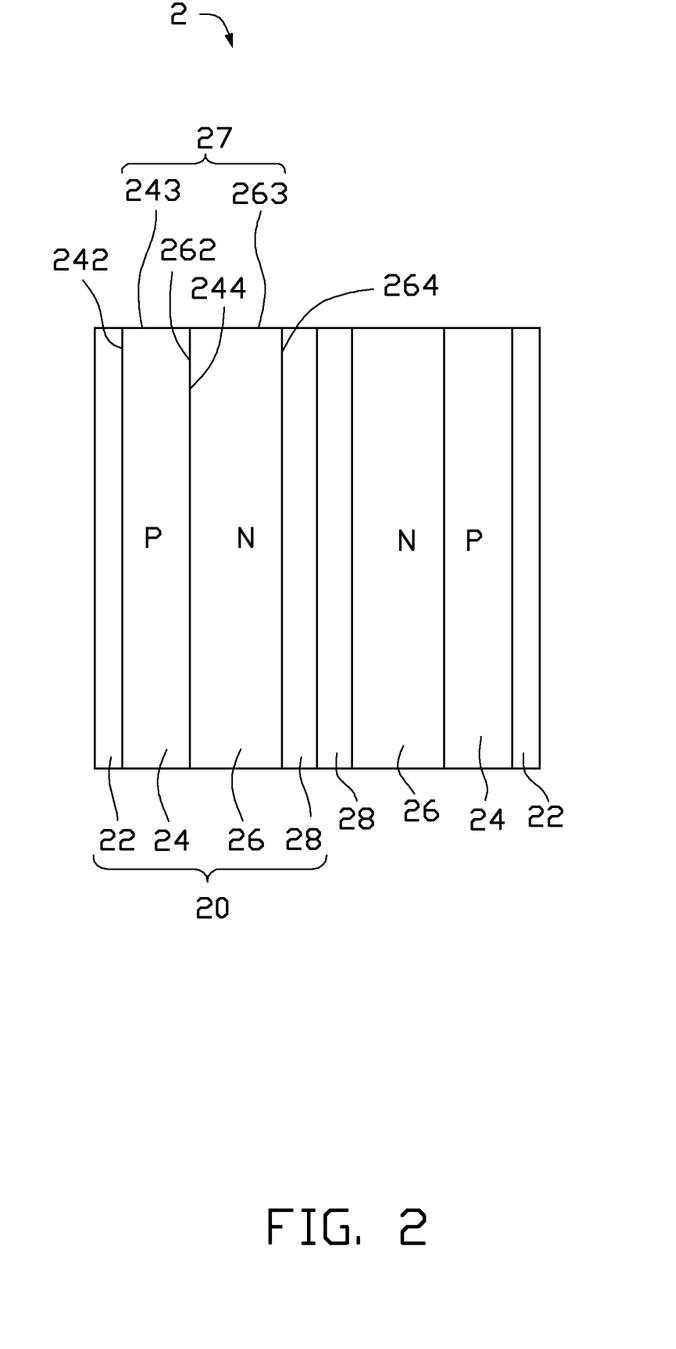
FIG. 2 is a schematic, cross-sectional view of the solar cell system, along a line II-II of FIG. 1.

Referring to FIGS. 1 and 2, a first embodiment of a solar cell system 2 includes two solar cells 20 located in contact with each other and connected in parallel. Each solar cell 20 includes a first electrode layer 22, a P-type silicon layer 24, an N-type silicon layer 26, and a second electrode layer 28. The first electrode layer 22, the P-type silicon layer 24, the N-type silicon layer 26, and the second electrode layer 28 of the solar cell 20 can be arranged in series alone a first direction, side by side and in contact with each other, in that order. The two second electrode layers 28 of the two solar cells 20 are located in contact with each other directly so that the two solar cells 20 cooperatively form an integrated structure. In one embodiment, the P-type silicon layers 24 and the N-type silicon layers 26 of the solar cell system 2 are arranged in that order -P-N-N-P- along the first direction. In other embodiment, the P-type silicon layers 24 and the N-type silicon layers 26 of the solar cell system 2 can be arranged in that order -N-P-P-N- along the first direction. Namely, the adjacent two silicon layers of the solar cell system 2 should be in the same type. In one embodiment, the first direction is defined as X direction, a direction perpendicular to the X direction is defined as Y direction, and a direction perpendicular to both the X direction and Y direction is defined as Z direction.

The two first electrode layers 22 of the two solar cells 20 are electrically connected to a positive terminal (not shown) via two wires (not labeled) so that the two P-type silicon layers 24 are electrically connected to an external load (not shown) to apply a positive voltage. The two second electrode layers 28 of the two solar cells 20 are electrically connected to a negative terminal (not shown) via a wire (not labeled) so that the two N-type silicon layers 26 are electrically connected to an external load (not shown) to apply a negative voltage. In use, each solar cell 20 and the external load can have an independent loop circuit via wires. The working current flowing through the external load is the sum of the working current of the two independent loop circuits.

In the embodiment, the first electrode layer 22, the P-type silicon layer 24, the N-type silicon layer 26, and the second electrode layer 28 of each solar cell 20 have the same shape and area. The two second electrode layers 28 of the two solar cells 20 are not entirely overlapped. The two second electrode layers 28 of the two solar cells 20 are dislocated along the Y direction, the Z direction or both the Y direction and the Z direction. Part of the second electrode layer 28 is exposed and configured to be in contact with the wires. The overlapped area of the adjacent two second electrode layers 28 is not limited and can be selected according to need.

The P-type silicon layer 24 is a laminar structure. In particular, the P-type silicon layer 24 has a first side surface 242 and a second side surface 244 opposite to the first side surface 242. The N-type silicon layer 26 is also a laminar structure and located on the second side surface 244. The N-type silicon layer 26 has a third side surface 262 and a fourth side surface 264 opposite to the third side surface 262. The first electrode layer 22 is electrically connected with and contacting the first side surface 242 of the P-type silicon layer 24. The second electrode layer 28 is electrically connected with and contacting the fourth side surface 264 of the N-type silicon layer 26. The second side surface 244 of the P-type silicon layer 24 and the third side surface 262 of the N-type silicon layer 26 are electrically connected with and contacting each other to form a P-N junction. The P-N junction is formed near an interface between the P-type silicon layer 24 and the N-type silicon layer 26.

The P-type silicon layer 24 has a first top surface 243 and a first bottom surface (not labeled) connected with the first side surface 242 and the second side surface 244. The N-type silicon layer 26 has a second top surface 263 and a second bottom surface (not labeled) connected with the third side surface 262 and the fourth side surface 264. The first top surface 243 and the second top surface 263 are coplanar to form a photoreceptive surface 27 to receive an incident light. The P-N junction is exposed out from the photoreceptive surface 27. The photoreceptive surface 27 is parallel with a surface defining by the X direction and the Y direction. Alternatively, the photoreceptive surface 27 can be parallel with a surface defining by the X direction and the Z direction. That is, the photoreceptive surface 27 can be a uneven surface because of the dislocation of the two solar cells 20.

A thickness of the solar cell 20 is a distance between the photoreceptive surface 27 and the surface opposite to the photoreceptive surface 27 along the Z direction. When the photoreceptive surface 27 is substantially perpendicular to the fourth side surface 264, the thickness of the solar cell 20 is a width of the P-type silicon layer 24, N-type silicon layer 26, a first electrode layer 22, and a second electrode layer 28 along a direction perpendicular to the photoreceptive surface 27. The thickness of the solar cell 20 is not limited, and can be set by light transmittance of the P-type silicon layer 24 and the N-type silicon layer 26. Specifically, if the light transmittance of the P-type silicon layer 24 and the N-type silicon layer 26 is large, the thickness of the solar cell 20 can appropriately increase to decrease the light transmittance. Consequently, the solar cell 20 can efficiently absorb the light. In one embodiment, the thickness of the solar cell 20 is in a range from about 50 μm to about 300 μm.

A material of the P-type silicon layer 24 can be monocrystalline silicon, polycrystalline silicon, or other P-type semiconducting material. A thickness of the P-type silicon layer 24 along a direction from the first side surface 242 to the second side surface 244 can be in a range from about 200 micrometers (μm) to about 300 μm. An angle between the first top surface 243 and the first side surface 242 or the second side surface 244 can be larger than 0 degrees and less than 180 degrees. In one embodiment, the angle is about 90 degrees, namely, the first top surface 243 is substantially perpendicular to the first side surface 242 and the second side surface 244, and the P-type silicon layer 24 is a P-type monocrystalline silicon sheet having 200 μm in thickness.

The N-type silicon layer 26 can be formed by injecting superfluous N-type doping elements (e.g. phosphorus or arsenic) into a silicon sheet. A thickness of the N-type silicon layer 26, along a direction from the third side surface 262 to the fourth side surface 264, can be in a range from about 10 nanometers (nm) to about 1 μm. An angle between the second top surface 263 and third side surface 262 and the fourth side surface 264 can be larger than 0 degrees and less than 180 degrees. In one embodiment, the angle is about 90 degrees, namely, the first side surface 263 is perpendicular to the third side surface 262 and the fourth side surface 264, and the thickness of the N-type silicon layer 26 is about 50 nm.

An inner electric field having a field direction from the N-type silicon layer 26 to P-type silicon layer 24 is formed, because surplus electrons in the N-type silicon layer 26 diffuse across the P-N junction and reach the P-type silicon layer 24. When a plurality of electron-hole pairs are generated in the P-N junction due to excitation of an incident light, the electrons and the holes are separated from each other under the inner electric field. Specifically, the electrons in the N-type silicon layer 26 move toward the second electrode layer 28, and are gathered by the second electrode layer 28. The holes in the P-type silicon layer 24 move toward the first electrode layer 22, and are gathered by the first electrode layer 22. Thus, a current is formed, thereby realizing a conversion from the light energy to the electrical energy.

In use, the incident light does not reach the P-N junction through the first electrode layer 22, namely, the first electrode layer 22 will not obstruct the incident light to reach the P-N junction. Thus, the first electrode layer 22 can be a continuous planar shaped structure coated on the entire first side surface 242 of the P-type silicon layer 24, or a lattice shaped structure coated on a part of the first side surface 242 of the P-type silicon layer 24. A material of the first electrode layer 22 is conductive material, such as metal, conducting polymer, indium tin oxide, or carbon nanotube structure. In one embodiment, the first electrode layer 22 is made of a metal material layer having a continuous planar shaped structure and coated on the entire first side surface 242. The metal material can be aluminum, copper, or silver. A thickness of the first electrode layer 22 is not limited, and can be in a range from about 50 nm to about 300 nm. In one embodiment, the first electrode layer 22 is an aluminum sheet having a thickness of 200 nm.

Furthermore, the incident light does not reach the P-N junction through the second electrode layer 28. Thus, the second electrode layer 28 can be a continuous planar shaped structure coated on the entire fourth side surface 264 of the N-type silicon layer 26, or a lattice shaped structure partially coated on the fourth side surface 264. A material of the second electrode layer 28 can be conductive material, such as metal, conducting polymer, indium tin oxide, or carbon nanotube structure. In one embodiment, the second electrode layer 28 is made of a metal layer having a continuous planar shaped structure and coated on the entire fourth side surface 264. The metal can be aluminum, copper, or silver. A thickness of the second electrode layer 28 is not limited, and can be in a range from about 50 nm to about 300 nm. In one embodiment, the second electrode layer 28 is an aluminum sheet having a thickness of 200 nm.

In addition, the material of the first electrode layer 22 and the second electrode layer 28 can be opaque to avoid leakage of the incident light passing through the first electrode layer 22 and the second electrode layer 28, thus the photoelectric conversion efficiency of the solar cell 20 is improved.

In addition, an angle between the photoreceptive surface 27 and the fourth side surface 264 of the N-type silicon layer 26 can be in a range from about 0 degrees to about 180 degrees. In one embodiment, the angle is about 90 degrees.

Furthermore, an antireflection layer (not shown) can be disposed on the photoreceptive surface 27 to decrease reflection of the incident light and increase absorption of the incident light. The antireflection layer can absorb little light. A material of the antireflection layer can be silicon nitride ($Si_3N_4$) or silicon dioxide ($SiO_2$). A thickness of the antireflection layer can be less than 150 nm. In one embodiment, the antireflection layer is the silicon nitride layer having the thickness of 900 angstrom (Å).

Furthermore, a reflector (not shown) can be located on the surface opposite to the photoreceptive surface 27. The reflector can be a continuous reflection layer directly in contact with the surface and spaced from the first electrode layer 22 and the second electrode layer 28. The reflector can be made of metal such as aluminum, gold, copper or silver. The thickness of the reflector can be in a range from about 10 nm to about 100 μm. In one embodiment, the reflector is aluminum foil with a thickness of about 50 nm. The reflector can be formed on the surface by vacuum evaporation or magnetron sputtering.

The incident light irradiates the photoreceptive surface 27 of solar cell 20. The second electrode layer 28 does not coat the photoreceptive surface 27, namely, the P-N junction is directly exposed from the photoreceptive surface 27. Thus, the photons in the incident light directly reach the P-N junction without passing through the second electrode layer 28 and the first electrode layer 22, and can be directly absorbed by the P-N junction. Accordingly, the second electrode layer 28 and the first electrode layer 22 cannot obstruct the incident light to reach the P-N junction, thereby increasing the light absorbing efficiency of the P-N junction. Correspondingly, the P-N junction can excite more electron-hole pairs under the irradiation of the incident light. In addition, the second electrode layer 28 can have any shape and cannot obstruct light. In one embodiment, the second electrode layer 28 having a planar shaped structure is coated on the entire fourth side surface 264 of the N-type silicon layer 26. Thus, the second electrode layer 28 has a large area, thereby decreasing the diffusing distance of the carriers in the second electrode layer 28 and the interior loss of the carriers, and increasing the photoelectric conversion efficiency of the solar cell 20. In addition, two solar cells 20 located in contact with each other and connected in parallel allow the solar cell system 2 to apply greater current to external load.

The first electrode layer 22 and the second electrode layer 28 will not obstruct the light to irradiate the P-N junction. Thus, the shape and structure of the first electrode layer 22 and the second electrode layer 28 can be arbitrarily set, thereby decreasing the complexity of fabricating the solar cell 20.

Figure 3:
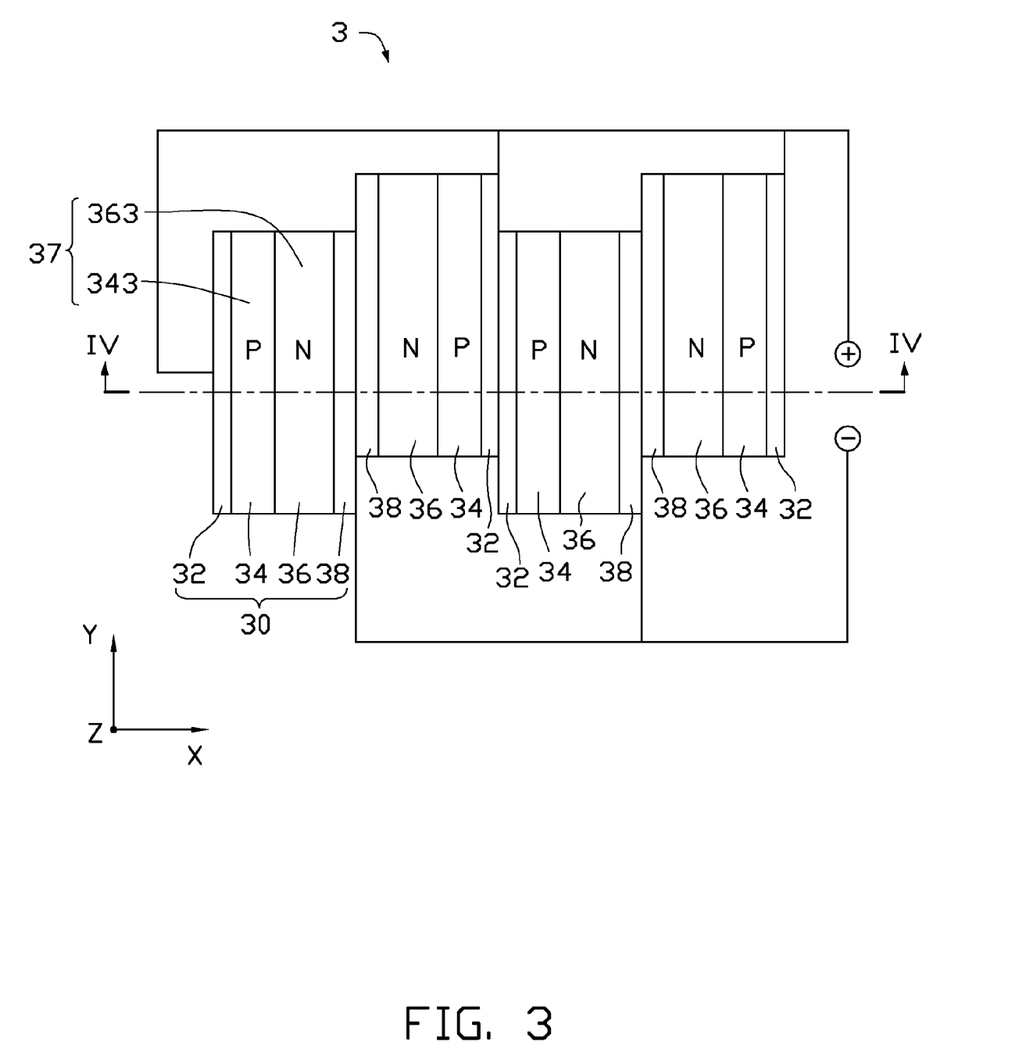
FIG. 3 is a top view of a second embodiment of a solar cell system.
Figure 4:
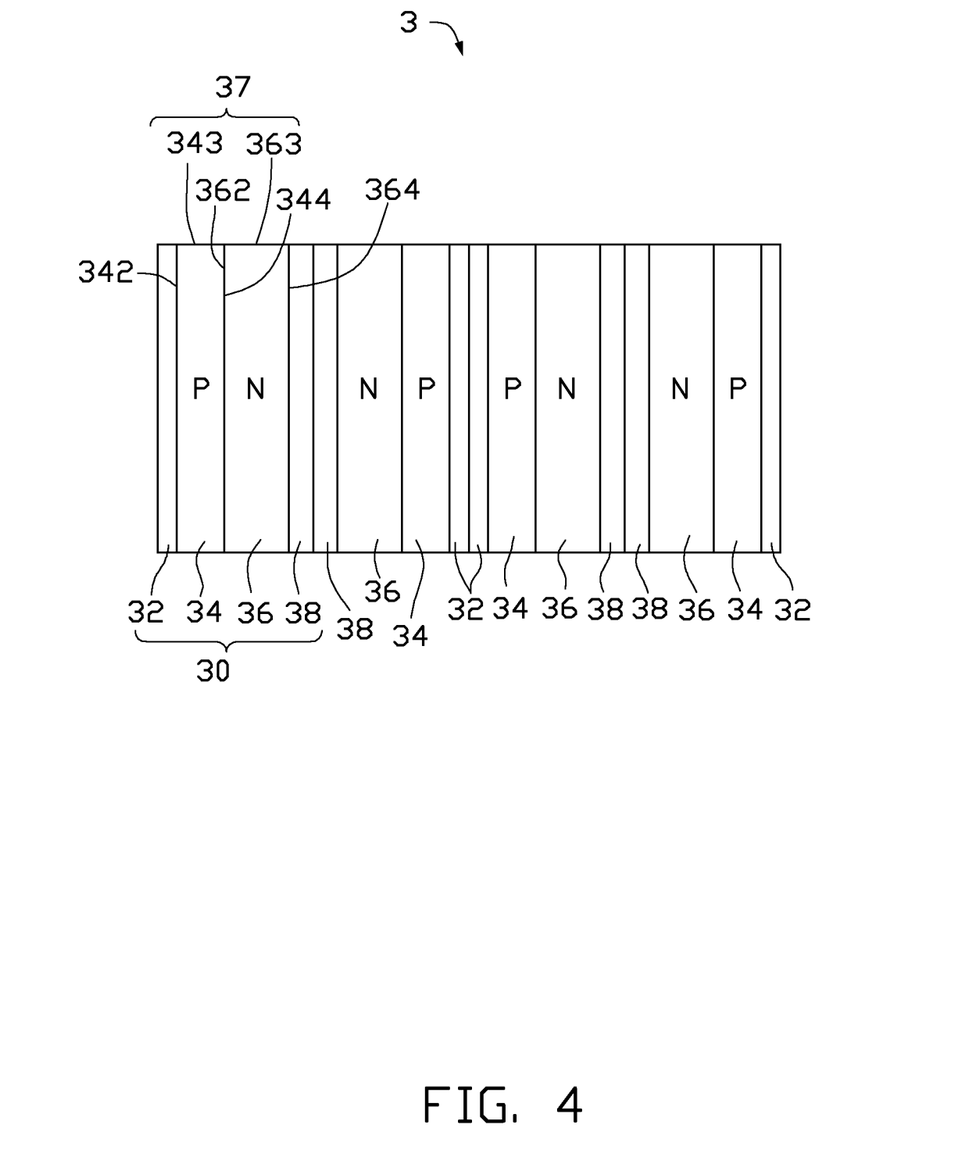
FIG. 4 is a schematic, cross-sectional view of the solar cell system, along a line IV-IV of FIG. 3.

Referring to FIGS. 3 and 4, a second embodiment of a solar cell system 3 includes a plurality of solar cells 30 located in contact with each other and connected in parallel. Each solar cell 30 includes a first electrode layer 32, a P-type silicon layer 34, an N-type silicon layer 36, and a second electrode layer 38. The first electrode layer 32, the P-type silicon layer 34, the N-type silicon layer 36, and the second electrode layer 38 of the solar cell 30 can be arranged in series alone X direction, side by side and in contact Page 12 of 22 with each other, in that order. The P-type silicon layers 34 and the N-type silicon layers 36 of the solar cell system 3 are arranged in that order of -P-N-N-P-P-N-N-P- or -N-P-P-N-N-P-P-N- along the X direction. Namely, the adjacent two silicon layers of the solar cell system 3 should be in the same type.

The solar cell system 3 is similar to the solar cell system 2 above except that the number of solar cells 30 is 'N', where 'N' is a natural number equal to or greater than 3. In one embodiment, the 'N' is 100. In particular, the solar cells 30 are numbered as 1, 2, 3, 4, 5 . . . n−1, n, n+1 . . . 100. The first electrode layer 32 of the nth solar cell 30 is in contact with the first electrode layer 32 of the (n+1)th solar cell 30. The second electrode layer 38 of the nth solar cell 30 is in contact with the second electrode layer 38 of the (n−1)th solar cell 30. All the first electrode layers 32 of the solar cell system 3 are electrically connected to a positive terminal (not shown) via a plurality of wires (not labeled) so that all the P-type silicon layers 34 are electrically connected to an external load (not shown) to apply a positive voltage. All the second electrode layer 38 of the solar cell system 3 are electrically connected to a negative terminal (not shown) via a plurality of wire (not labeled) so that all the N-type silicon layers 36 are electrically connected to an external load (not shown) to apply a negative voltage. In use, each solar cell 30 can form an independent loop circuit with the external load via wires. The working current flowing through the external load is the sum of the working current of all the independent loop circuits.

Furthermore, adjacent two solar cells 30 are dislocated along the Y direction, the Z direction or both the Y direction and the Z direction. In one embodiment, the adjacent two solar cells 30 are dislocated along the Y direction so that all the solar cells 30 are arranged along the Y direction to form a staircase-shaped structure. In one embodiment, the projections along the X direction of the solar cells 30 in even number are overlapped and the projections along the X direction of the solar cells 30 in odd number are overlapped.

The solar cell 30 is the same as the solar cell 20. Referring to FIG. 4, the P-type silicon layer 34 has a first side surface 342 and a second side surface 344 opposite to the first side surface 342. The N-type silicon layer 36 has a third side surface 362 and a fourth side surface 364 opposite to the third side surface 362. The P-type silicon layer 34 also has a first top surface 343 connected with the first side surface 342 and the second side surface 344. The N-type silicon layer 36 also has a second top surface 363 connected with the third side surface 362 and the fourth side surface 364. The first top surface 343 and the second top surface 363 are coplanar to form a photoreceptive surface 37 to receive an incident light.

Figure 5:
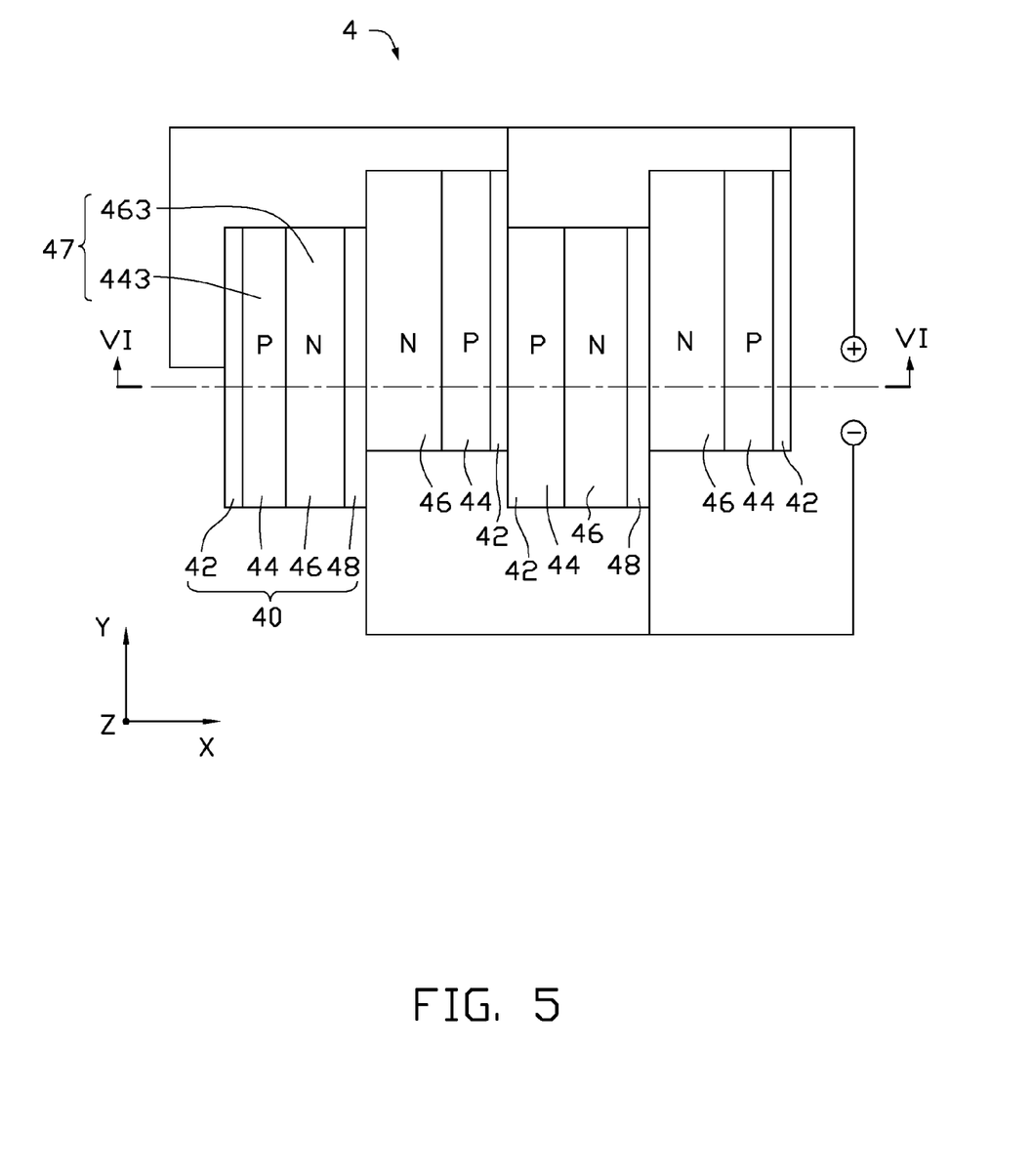
FIG. 5 is a top view of a third embodiment of a solar cell system.
Figure 6:
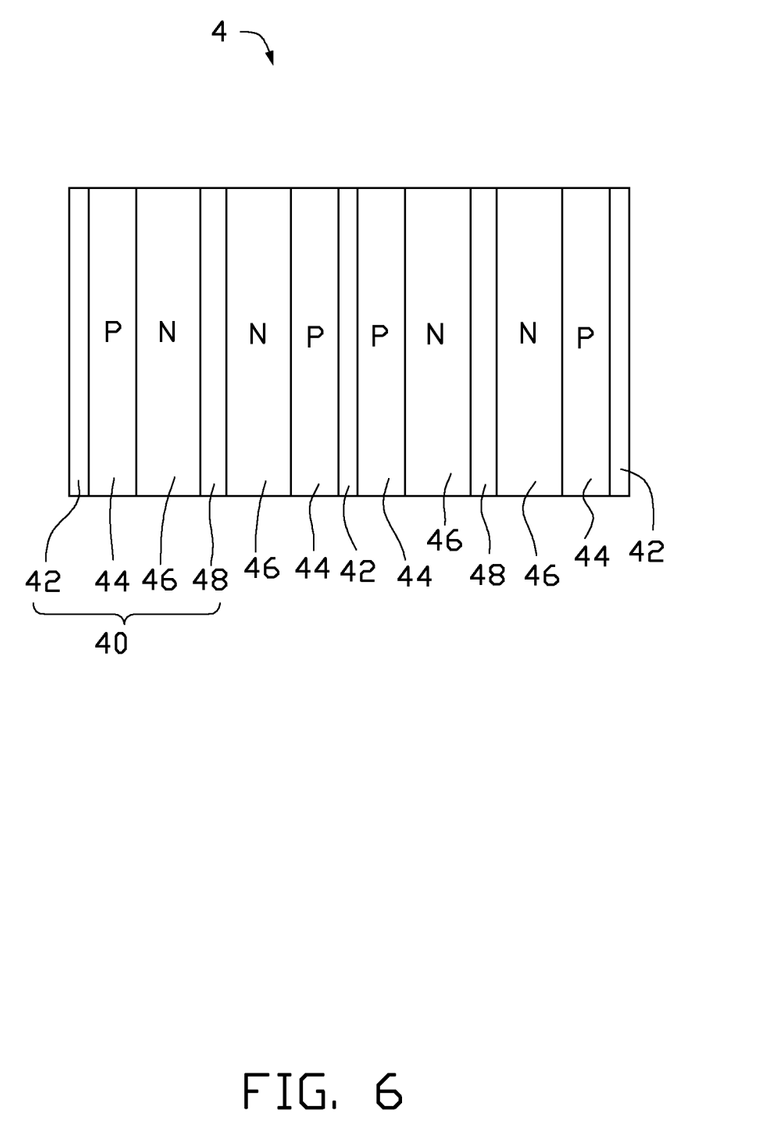
FIG. 6 is a schematic, cross-sectional view of the solar cell system, along a line VI-VI of FIG. 5.

Referring to FIGS. 5 and 6, a third embodiment of a solar cell system 4 includes a plurality of solar cells 40 located in contact with each other and connected in parallel. Each solar cell 40 includes a first electrode layer 42, a P-type silicon layer 44, an N-type silicon layer 46, and a second electrode layer 48. The first electrode layer 42, the P-type silicon layer 44, the N-type silicon layer 46, and the second electrode layer 48 of the solar cell 40 can be arranged in series alone X direction, side by side and in contact with each other, in that order. The P-type silicon layers 44 and the N-type silicon layers 46 of the solar cell system 4 are arranged in that order of -P-N-N-P-P-N-N-P- or -N-P-P-N-N-P-P-N- along the X direction. Namely, the adjacent two silicon layers of the solar cell system 4 should be in the same type.

The solar cell system 4 is similar to the solar cell system 3 above except that adjacent two solar cells 40 share a common first electrode layer 42 or common second electrode layer 48. In particular, the solar cells 40 are numbered as 1, 2, 3, 4, 5 . . . n−1, n, n+1 . . . 100. The nth solar cell 40 and the (n+1)th solar cell 40 share a common first electrode layer 42. The nth solar cell 40 and the (n−1)th solar cell 40 share a common second electrode layer 48.

The solar cell 40 is the same as the solar cell 20. Referring to FIG. 5, the P-type silicon layer 44 has a second top surface 443, and the N-type silicon layer 46 has a second top surface 463. The first top surface 443 and the second top surface 463 are coplanar to form a photoreceptive surface 47 to receive an incident light.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A solar cell system, comprising:
a plurality of solar cells, each of the plurality of solar cells comprising:
a first electrode layer, a P-type silicon layer, an N-type silicon layer, a second electrode layer, wherein the first electrode layer, the P-type silicon layer, the N-type silicon layer, and the second electrode layer are arranged in series side by side along a first direction and in contact with each other, thereby cooperatively forming an integrated structure and a P-N junction is formed near an interface between the P-type silicon layer and the N-type silicon layer, the integrated structure having a first surface substantially parallel to the first direction and a second surface opposite to the first surface, the first surface is used as a photoreceptive surface to directly receive incident light;
wherein the plurality of solar cells are connected in parallel and stacked with each other so that the first direction is substantially perpendicular to each layer of the plurality of solar cells, two adjacent solar cells of the plurality of solar cells are dislocated, the solar cells in even number are dislocated along a second direction perpendicular to the first direction, and the solar cells in odd number are dislocated along an opposite direction of the second direction; wherein projections along the first direction in even number are entirely overlapped with each other, and projections along the first direction in odd number are entirely overlapped with each other.

2. The solar cell system of claim 1, wherein the P-type silicon layers and the N-type silicon layers are arranged in that order of -P-N-N-P-P-N-N-P- or -N-P-P-N-N-P-P-N along the first direction.

3. The solar cell system of claim 1, wherein two adjacent solar cells of the plurality of solar cells share a common first electrode layer or a common second electrode layer.

4. The solar cell system of claim 1, wherein one of the first electrode layer, the P-type silicon layer, the N-type silicon layer and the second electrode layer of each solar cell has the same shape and area as another one of the first electrode layer, the P-type silicon layer, the N-type silicon layer and the second electrode layer of each solar cell.

5. The solar cell system of claim 1, wherein the P-type silicon layer has a third surface, a fourth surface opposite to the third surface, and a fifth side surface connecting the third surface and the fourth surface; the N-type silicon layer has a sixth surface, a seventh surface opposite to the sixth surface, and an eighth side surface connecting the sixth surface and the seventh surface; the first electrode layer is electrically contacted with the third surface, and the second electrode layer is electrically contacted with the seventh surface.

6. The solar cell system of claim 5, wherein the first electrode layer has a continuous planar shaped structure coated on the entire third surface, and the second electrode layer has a continuous planar shaped structure coated on the entire seventh surface.

7. The solar cell system of claim 6, wherein the first electrode layer and the second electrode layer are opaque metal material layers.

8. The solar cell system of claim 5, wherein the incident light irradiates the photoreceptive surface along a direction substantially perpendicular to the first surface.

9. The solar cell system of claim 1, wherein an antireflection layer having a thickness of about 150 nm is coated on the first surface.

10. The solar cell system of claim 9, wherein a material of the antireflection layer is silicon nitride or silicon dioxide.

11. The solar cell system of claim 1, wherein the P-N junction is exposed out from the photoreceptive surface.

12. The solar cell system of claim 1, wherein a thickness of the solar cell between the first surface and the second surface is in a range from about 50 μm to about 300 μm.

13. The solar cell system of claim 1, wherein a reflector is located on the second surface.

14. The solar cell system of claim 13, wherein the reflector is a continuous reflection layer directly in contact with the second surface and spaced from the first electrode layer and the second electrode layer.

15. The solar cell system of claim 13, wherein the reflector is made of metal selected from group consisting of aluminum, gold, copper and silver.

* * * * *